(12) United States Patent
Lee et al.

(10) Patent No.: US 12,713,969 B2
(45) Date of Patent: Aug. 18, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Hyeon Gyu Lee, Incheon (KR); Byong Jin Kim, Seoul (KR); Kyoung Yeon Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 763 days.

(21) Appl. No.: 17/970,660

(22) Filed: Oct. 21, 2022

(65) Prior Publication Data

US 2024/0136242 A1 Apr. 25, 2024
US 2024/0234232 A9 Jul. 11, 2024

(51) Int. Cl.
*H10W 74/10* (2026.01)
*H10W 70/68* (2026.01)
*H10W 74/01* (2026.01)

(52) U.S. Cl.
CPC ......... *H10W 74/131* (2026.01); *H10W 70/68* (2026.01); *H10W 74/016* (2026.01)

(58) Field of Classification Search
None
See application file for complete search history.

(56) References Cited

U.S. PATENT DOCUMENTS 8,138,590 B2 3/2012 Chow et al.
10,717,645 B2 7/2020 Feyh et al.
2013/0087197 A1 4/2013 Chan
2017/0147857 A1 5/2017 Liu
2018/0218957 A1 8/2018 Osterwald et al.
2024/0136242 A1* 4/2024 Lee .................... H10W 74/131

FOREIGN PATENT DOCUMENTS

KR 20010111799 A 12/2001

* cited by examiner

*Primary Examiner* — Jack S Chen
(74) *Attorney, Agent, or Firm* — Spectrum IP Law Group LLC

(57) ABSTRACT

In one example, an electronic device comprises a base, a substrate over the base and comprising a top side, a bottom side, and a conductive structure, wherein the substrate further comprises a channel opening and an aperture, and wherein the bottom side of the substrate is oriented toward the base, an electronic component over the top side of the substrate and over the aperture, wherein the electronic component is coupled with the conductive structure, and a funnel over the top side of the substrate and comprising a funnel opening. A top side of the electronic component is exposed through the funnel opening. Other examples and related methods are also disclosed herein.

17 Claims, 16 Drawing Sheets

10
147
142
13
132
141
14
118
1181
1184
117
113
112
115
11
128
1185
1182
131
111
131a
116
12

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1A:
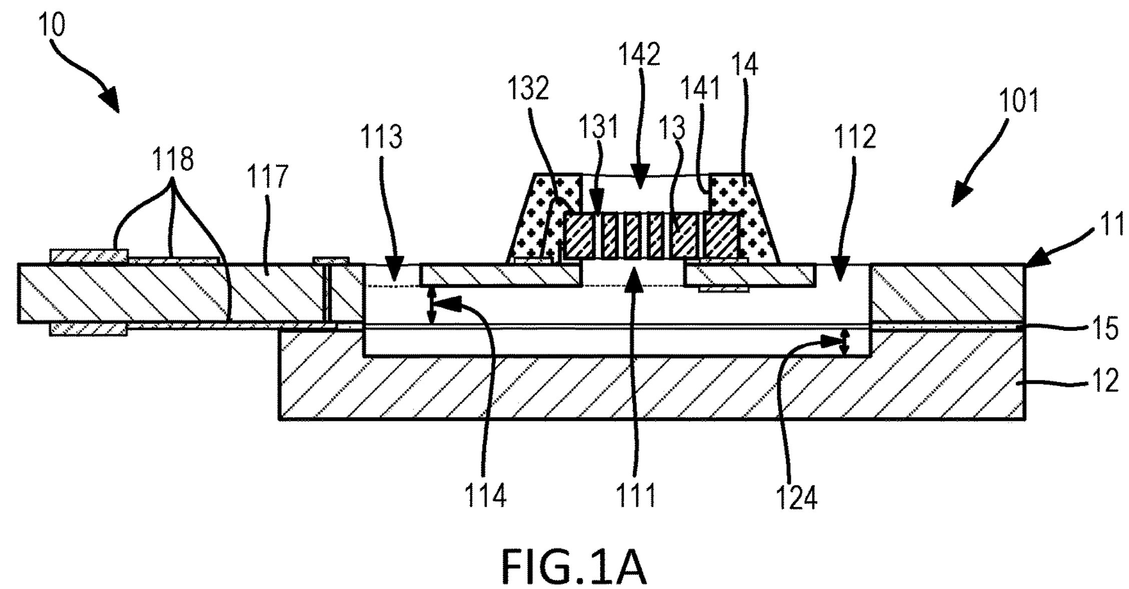
FIGS. 1A, 1B, and 1C show a cross-sectional view, a top view, and a bottom view, respectively, of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Coupled can refer to an electrical coupling or a mechanical coupling. Similarly, the terms "over" or "on" may be used to describe two elements directly contacting each other or describe two elements indirectly connected by one or more other elements.

Crosshatching lines may be used throughout the figures to denote different parts, but not necessarily to denote the same or different materials. Throughout the present disclosure, like reference numbers denote like elements. Accordingly, elements with like element numbering may be shown in the figures but may not be necessarily repeated herein for the sake of clarity.

DESCRIPTION

In one example, an electronic device comprises a base, a substrate over the base and comprising a top side, a bottom side, and a conductive structure, wherein the substrate further comprises a channel opening and an aperture, and wherein the bottom side of the substrate is oriented toward the base, an electronic component over the top side of the substrate and over the aperture, wherein the electronic component is coupled with the conductive structure, and a funnel over the top side of the substrate and comprising a funnel opening. A top side of the electronic component is exposed through the funnel opening.

In another example, an electronic package comprises a substrate comprising a conductive structure, a top side, and a bottom side, a base coupled with the bottom side of the substrate, an electronic component over the top side of the substrate and coupled with the conductive structure, wherein the electronic component comprises a plurality vias extending through the electronic component, and a funnel over the top side of the substrate and surrounding the electronic component. A fluid channel is defined in at least one of the substrate or the base, and the substrate comprises a channel opening extending from the top side of the substrate to the bottom side of the substrate and to the fluid channel.

In yet another example, a method to manufacture an electronic package comprises providing a base, providing a substrate over the base and comprising a top side, a bottom side, and a conductive structure, wherein the substrate comprises a channel opening and an aperture, and wherein the bottom side of the substrate is oriented toward the base, providing an electronic component over the top side of the substrate and over the aperture, wherein the electronic component is coupled with the conductive structure, and providing a funnel over the top side of the substrate and comprising a funnel opening, wherein a top side of the electronic component is exposed through the funnel opening.

Other examples are included in the present disclosure. Such examples may be found in the figures, in the claims, or in the description of the present disclosure.

Figure 1B:
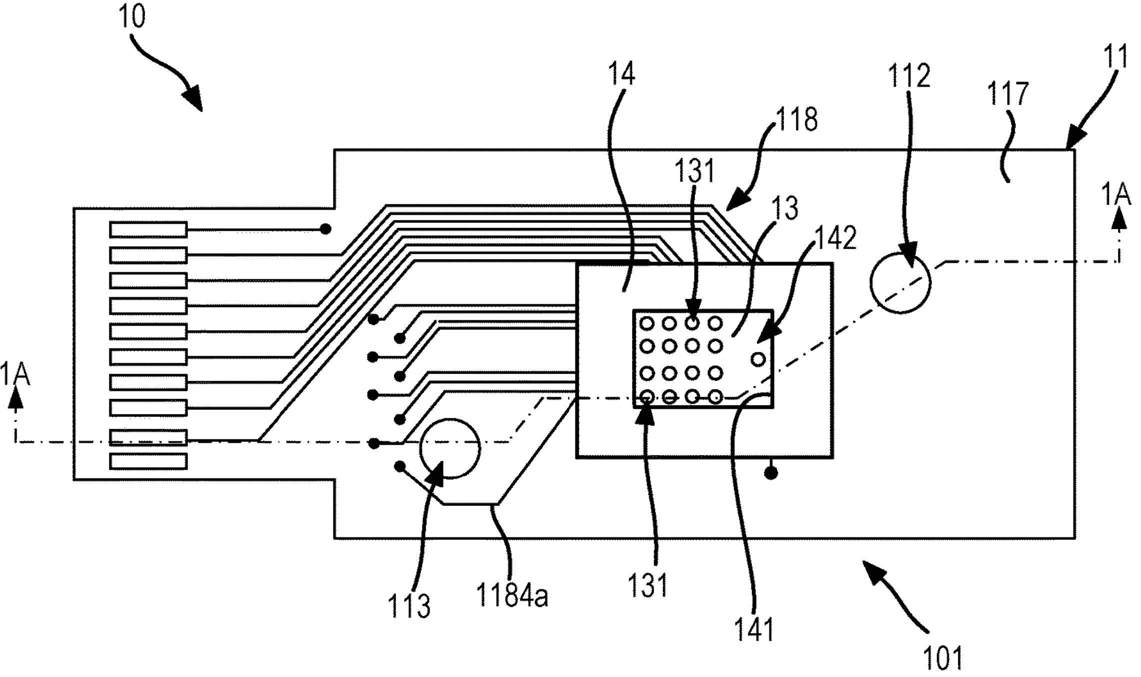
Figure 1C:
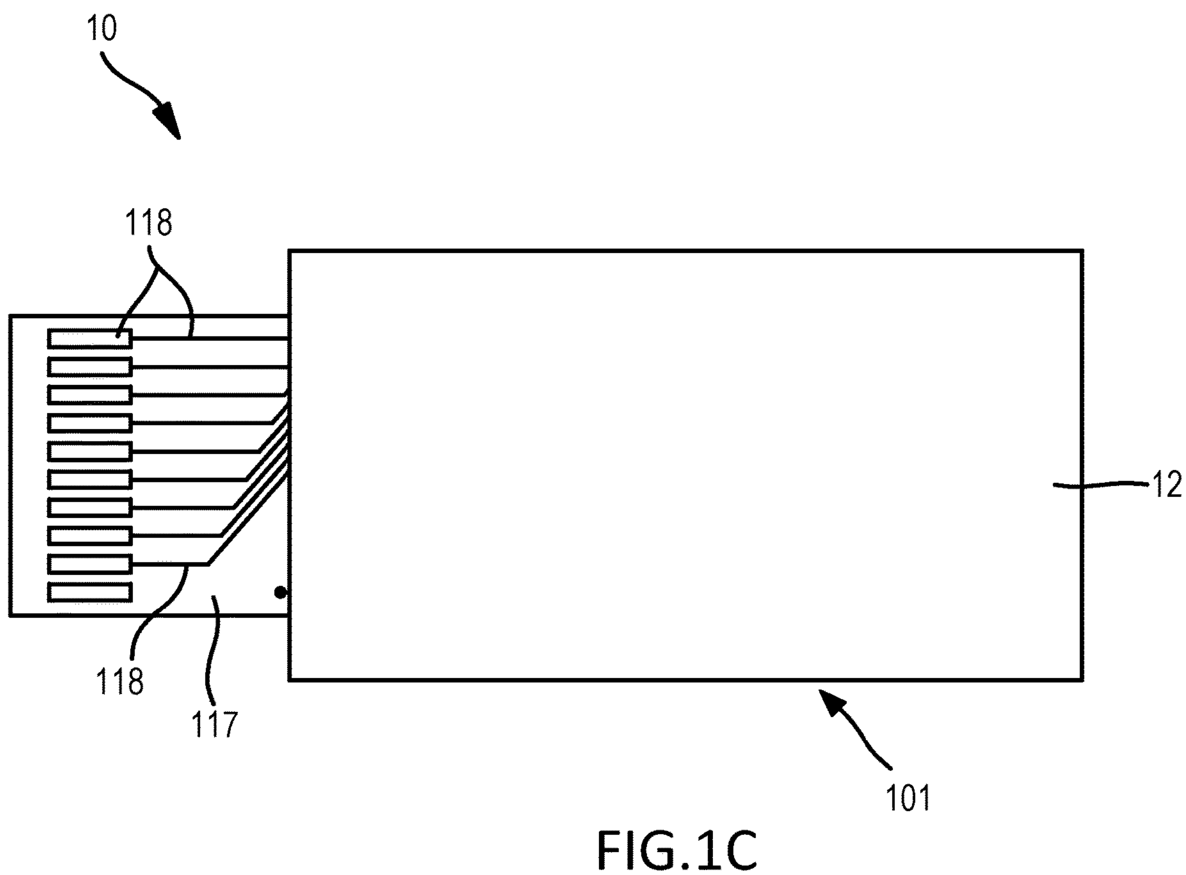

FIGS. 1A, 1B, and 1C show an example electronic device 10. FIG. 1A shows a cross-section view of electronic device 10 taken along the line 1A-1A in FIG. 1B. FIG. 1B shows a top-down view of electronic device 10. FIG. 1C shows a bottom-up view of electronic device 10. In the example shown in FIGS. 1A, 1B, and 1C, electronic device 10 can comprise substrate 11, base 12, electronic component 13, funnel 14, and adhesive 15.

Substrate 11 can be over base 12 and can comprise a top side, a bottom side, dielectric structure 117, conductive structure 118, aperture 111, channel openings 112 and 113, and substrate cavity 114. Channel opening 112 and 113 can extend from top side 115 of substrate 11 to bottom side 116 of substrate 11 to fluid channel 102. The bottom side of substrate 11 can be oriented toward base 12. Base 12 can comprise base cavity 124. In some examples, fluid channel 102 can comprise substrate cavity 114 in substrate 11 or base cavity 124 in base 12. In some examples, fluid channel 102 can comprise both substrate cavity 1143 and base cavity 124. Electronic component 13 can be over the top side of substrate 11 and can comprise one or more vias 131 and can be coupled to conductive structure 118 of substrate 11 by one or more component interconnects 132. Electronic component 13 can be coupled with conductive structure 118. Funnel 14 can be over the top side of substrate 11 and can comprise funnel sidewall 141 and funnel opening 142. A top side of electronic component 13 can be exposed through funnel opening 14.

Substrate 11, base 12, funnel 14, and adhesive 15 can comprise or be referred to as an electronic package 101 or package 101. Electronic package 101 can protect electronic component 13 from external elements or environmental exposure. Electronic package 101 can provide coupling between electronic component 13 and external components or between electronic component 13 and other electronic packages.

Figure 2A:
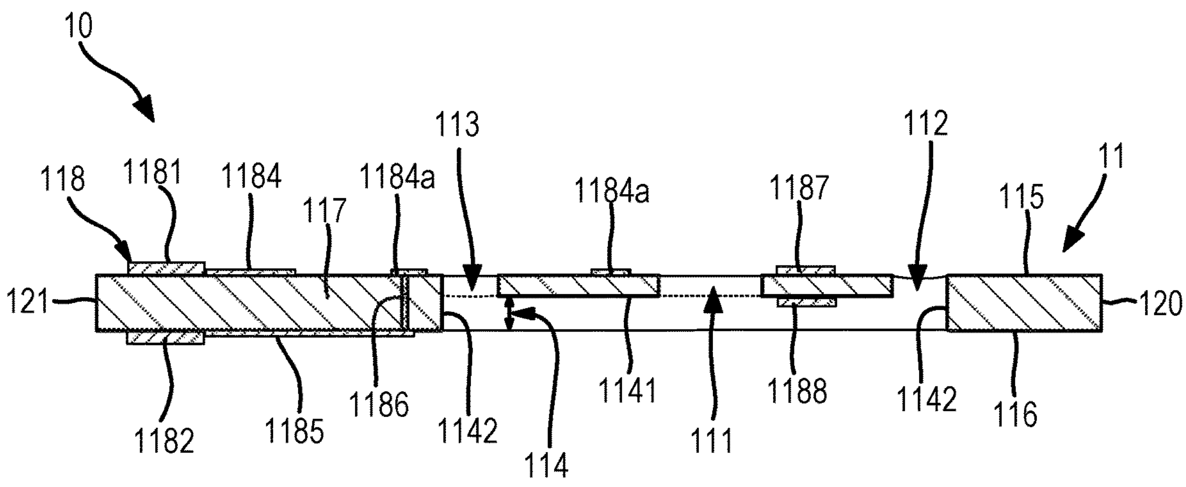
FIGS. 2A to 2I show various cross-sectional views, top views, and bottom views of an example method for manufacturing an example electronic device.
Figure 2B:
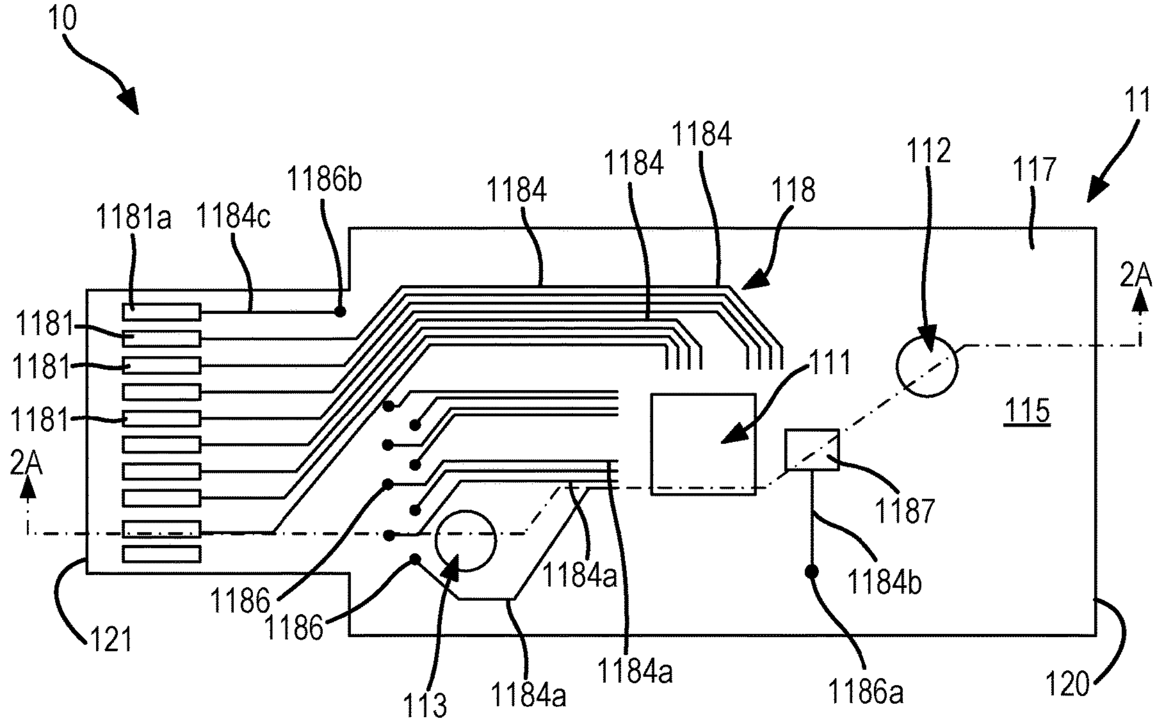
Figure 2C:
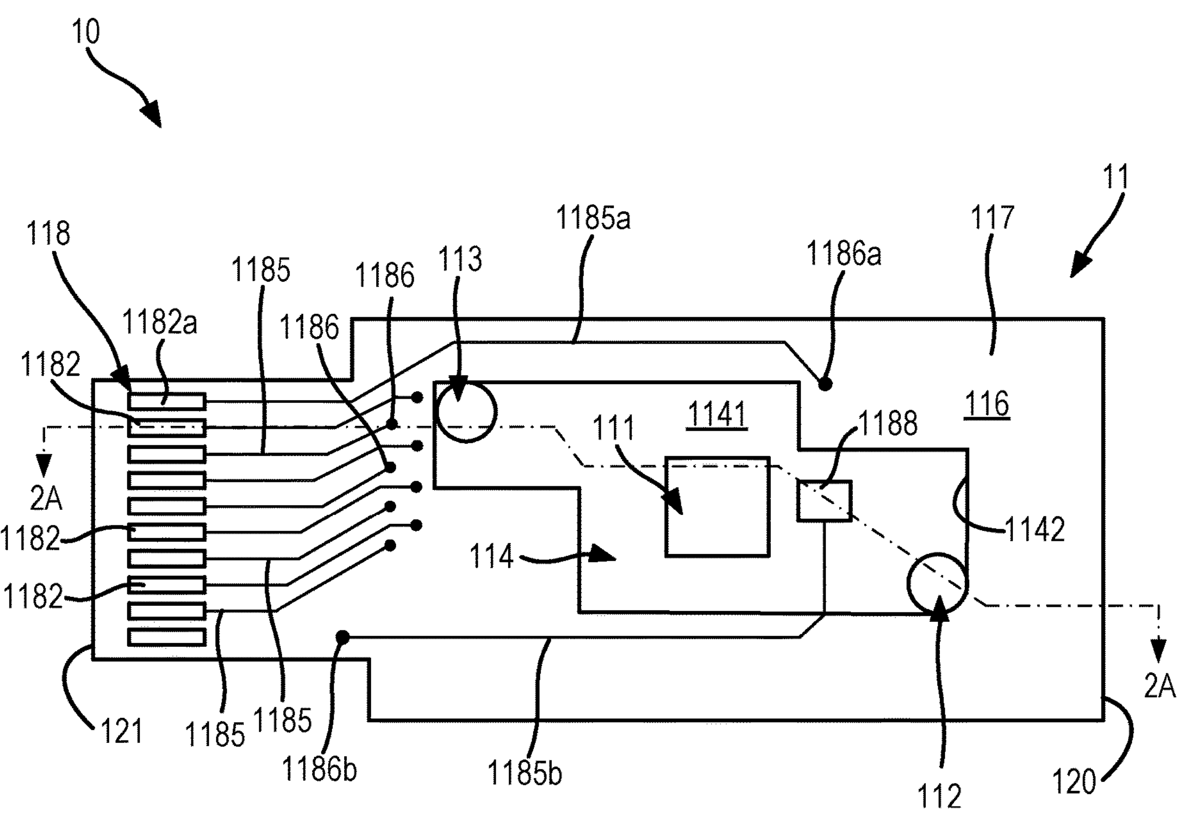

FIGS. 2A to 2I show an example method for manufacturing an example electronic device. FIGS. 2A, 2B, and 2C show electronic device 10 at an early stage of manufacture. FIG. 2A shows a cross-sectional view of substrate 11 taken along the line 2A-2A in FIGS. 2B and 2C. FIG. 2B shows a top-down view of a top side 115 of sub state 11. FIG. 2C shows a bottom-up view of a bottom side 116 of substrate 11. Top side 115 of substrate 11 is opposite and faces away from bottom side 116 of substrate 11. Bottom side 116 faces toward base 12 as shown in FIG. 1A.

In some examples, substrate 11 can comprise or be referred to as a printed circuit board (PCB), a laminate substrate, or a cavity substrate. Substrate 11 can comprise dielectric structure 117 and conductive structure 118. Substrate 11 can comprise aperture 111, channel openings 112 and 113, and substrate cavity 114. In some examples, the thickness of substrate 11, as measured between top side 115 and bottom side 116, can range from about 900 micrometers (μm) to about 1100 μm.

In some examples, dielectric structure 117 can comprise or be referred to as one or more dielectric layers, passivation layers, insulating layers, or protective layers. In some examples, dielectric structure 117 can include a polymer, polyimide (PI), benzocyclobutene (BCB), polybenzoxazole (PBO), bismaleimide triazine (BT), a molding material, a phenolic resin, epoxy, silicone, or an acrylate polymer. For instance, the one or more dielectric layers can comprise, one or more core layers, polymer layers, pre-preg layers, or solder mask layers stacked on each other. In some examples, dielectric structure 117 can be provided by spin coating, spray coating, printing, oxidation, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the thickness of the individual layers of dielectric structure 117 can range from about 400 μm to about 1000 μm. The combined thickness of all the layers of dielectric structure 117 can define the thickness of substrate 11.

One or more layers or elements of conductive structure 118 can be interposed or embedded between the one or more layers of dielectric structure 117. In some examples, portions of conductive structure 118 can be exposed from dielectric structure 118, while other portions of conductive structure 118 can be covered by dielectric structure 117. While various elements of conductive structure 118 are illustrated as formed over the top and bottom sides of dielectric structure 117, such configuration is for purposes of illustration only and the present disclosure is not limited in this regard. Further, it is contemplated and understood that elements of conductive structure 118 can be covered, at least partially, by dielectric structure 117. In some examples, dielectric structure 117 can maintain the external shape of substrate 11 and can structurally support conductive structure 118.

In some examples, conductive structure 118 can comprise or be referred to as one or more conductors, conductive materials, conductive paths, conductive layers, redistribution layers, wiring layers, circuit patterns, metal layers, traces, vias, pads, or UBMs. In some examples, conductive structure 118 can comprise copper, aluminum, palladium, titanium, tungsten, titanium/tungsten, nickel, gold, or silver. In some examples, conductive structure 118 can be provided by sputtering, electroless plating, electrolytic plating, PVD, CVD, MOCVD, ALD, LPCVD, or PECVD. Conductive structure 118 can be coupled to electronic component 13 through component interconnects 132 as shown in FIG. 1A. Conductive structure 118 can transmit signals, currents, or voltages within substrate 11. In some examples, the thickness of conductive structure 118 can range from about 10 μm to about 50 μm. The thickness of conductive structure 118 can refer to an individual layer of conductive structure 118.

Conductive structure 118 can comprise top external terminals 1181 located on top side 115 of substrate 11 and bottom external terminals 1182 located on bottom side 116 of substrate 11. Conductive structure 118 can include top traces 1184 and bottom traces 1185. One or more top traces 1184 can be coupled to top external terminals 1181. One or more bottom traces 1185 can be coupled to bottom external terminals 1182. Conductive structure 118 can include conductive paths 1186. Conductive paths 1186 can include one or more internal vias or internal traces coupling one or more bottom traces 1185 to one or more top traces 1184. For example, top traces 1184*a* can be coupled to bottom traces 1185 by conductive paths 1186.

In some examples, top and bottom external terminals 1181 and 1182 can comprise or be referred to as pads, lands, bond pads, or UBM. Top and bottom external terminals 1181 and 1182 can be exposed from dielectric structure 117 and can serve as electrical contacts between substrate 11 and an external component. In some examples, top and bottom external terminals 1181 and 1182 can comprise copper, aluminum, palladium, titanium, tungsten, titanium/tungsten, nickel, gold, or silver. For example, top and bottom external terminals 1181 and 1182 can be provided by sputtering, electroless plating, electrolytic plating, PVD, CVD, MOCVD, ALD, LPCVD, or PECVD. In some examples, the thickness of top external terminals 1181 and the thickness of bottom external terminals 1182 can each range from about 10 μm to about 50 μm. Top traces 1184 and 1184*a*, and bottom traces 1185 can comprise copper, aluminum, palladium, titanium, tungsten, titanium/tungsten, nickel, gold, or silver. For example, top traces 1184 and 1184*a*, and bottom traces 1185, can be provided by sputtering, electroless plating, electrolytic plating, PVD, CVD, MOCVD, ALD, LPCVD, or PECVD. In some examples, the thickness of top traces 1184 and 1184*a*, and the thickness of bottom traces 1185, can each range from about 10 μm to about 50 μm.

Conductive structure 118 can comprise top fluid terminal 1187 and bottom fluid terminal 1188. Top fluid terminal 1187 can be provided on top side 115 of substrate 11. Bottom fluid terminal 1188 can be provided on bottom side 116 of substrate 11 in substrate cavity 114, for example on substrate cavity floor 1141. In some examples, bottom fluid terminal can be on bottom side 116 of substrate 11 in fluid channel 102. In some examples, top fluid terminal 1187 can be coupled to bottom external terminal 1182. For example, top fluid terminal 1187 can be coupled to bottom external terminal 1182*a* through top trace 1184*b*, conductive path 1186*a*, and bottom trace 1185*a*. In some examples, bottom fluid terminal 1188 can be coupled to top external terminal 1181. For example, bottom fluid terminal 1188 can be coupled to top external terminal 1181*a* through a bottom trace 1185*b*, conductive path 1186*b*, and top side trace 1184*c*. At least, a portion of top fluid terminal 1187 and a portion of bottom fluid terminal 1188 can be exposed from dielectric structure 117. In some examples, top fluid terminal 1187 and bottom fluid terminal 1188 can comprise copper, aluminum, palladium, titanium, tungsten, titanium/tungsten, nickel, gold, or silver. For example, top and bottom fluid terminals 1187 and 1188 can be provided by sputtering, electroless plating, electrolytic plating, PVD, CVD, MOCVD, ALD, LPCVD, or PECVD. In some examples, the thickness of top fluid terminal 1187 and the thickness of bottom fluid terminal 1188 can each range from about 10 μm to about 50 μm.

Aperture 111 can be provided in and defined by substrate 11. In some examples, aperture 111 can comprise or be referred to as an opening or orifice. In some examples, the location of aperture 111 can correspond to the location of electronic component 113 as shown in FIG. 1A such that at least a portion of electronic component 13 overlaps aperture 111. In some examples, aperture 111 can have a rectangular shape; however, the present disclosure is not limited in this regard. For example. aperture 111 can be provided having a circular shape or any suitable shape. Aperture 111 can penetrate completely through substrate 11, such that aperture 111 extends from the bottom side 115 of substrate 11 to the top side 116 of substrate 11. In some examples, aperture 111 can be provided in the substrate cavity 114, such that aperture 111 extends from substrate cavity floor 1141 to top side 115 of substrate 11. In some examples, aperture 111 can be provided by removing a portion of substrate 11. For example, aperture 111 can be provided by removing a portion of substrate 11 from bottom side 116 using a mechanical drill or punch, etching, or a laser.

The area or footprint of aperture 111 can be smaller than the area or footprint of electronic component 13 of FIG. 1A. In some examples, aperture 111 can be fluidly connected to one or more vias 131 FIG. of electronic component 13 as shown in FIG. 1A. For example, and with momentary combined reference to FIGS. 2A and 2F, fluid such as test fluids, biological samples, mixtures of test fluids and biologic samples, or other liquids can be deposited on a top side 133 of electronic component 13 and can flow into substrate cavity 114 by flowing first through vias 131 and then through aperture 111. In some examples, the area of aperture 111 can range from about 4300 μm×4300 μm to about 4600 μm×4600 μm.

Returning to FIGS. 2A, 2B, 2C, channel openings 112 and 113 can be provided in and defined by substrate 11. In some examples, channel openings 112 and 113 can comprise or be referred to as orifices, vents, inlets, or apertures. In some examples, aperture 111 is located between channel opening 112 and channel opening 113. For example, channel opening 112 can be located closer to a first lateral side 120 of substrate 11 as compared to aperture 111, and channel opening 113 can be located closer to a second lateral side 121 of substrate 11 as compared to aperture 111. The second lateral side 121 can be opposite from the first lateral side 120. First and second lateral sides 120 and 121 can extend from top side 115 of substrate 11 to bottom side 116 of substrate 11. In some examples, lateral side 121 of substrate 11 can extend beyond a lateral side of base 12. Channel openings 112 and 113 can penetrate completely through substrate 11, such that channel openings 112 and 113 each extend from top side 115 of substrate 11 to bottom side 116 of substrate 11. In some examples, channel openings 112 and 113 can be provided in substrate cavity 114, such that channel openings 112 and 113 each extend from top side 115 of substrate 11 to substrate cavity floor 1141. In some examples, channel openings 112 and 113 can be provided by removing respective regions of substrate 11. For example, channel openings 112 and 113 can be provided by removing a portion of substrate 11 by using a mechanical drill or punch, etching, or a laser. In some examples, channel opening 112 can be an inlet through which fluid such as a test fluid is injected, and channel opening 113 can be a vent through which gas such as air is discharged in response to the injection of fluid into channel opening 112. In some examples, channel opening 112 can be employed as the gas vent and channel opening 113 can be employed as the liquid inlet. In some examples, the diameter of each of channel opening 112 and channel opening 113 can range from about 750 μm to about 850 μm.

In some examples, substrate 11 can include and define substrate cavity 114. Substrate cavity 114 can be provided on the bottom side 116 of substrate 11. Substrate cavity 114 can include and be defined by a substrate cavity floor 1141 and sidewalls 1142. Sidewalls 1142 can extend from substrate cavity floor 1141 to bottom side 116 of sub state 11. Substrate cavity floor 1141 can be recessed with respect to bottom side 116 of substrate 11. A first thickness of substrate 11, measured between top side 115 and bottom side 116 of substrate 11, is greater than a second thickness of substrate 11, measured between top side 115 and substrate cavity floor 1141. In some examples, substrate cavity 114 can overlap aperture 111 and channel openings 112 and 113. In some examples, substrate cavity 114 can have an area or footprint covering aperture 111 and channel openings 112 and 113. Substrate cavity 114 can provide a fluid path fluidly coupling aperture 111 and channel openings 112 and 113. Aperture 111 and channel openings 112 and 113 can fluidly couple substrate cavity 114 to top side 115 of sub state 11. In some examples, the horizontal length or width of substrate cavity 114 can correspond to a distance between channel opening 112 and channel opening 113, such that channel opening 112 is located at first end of substrate cavity 114 and channel opening 113 is located at second, opposing end of substrate cavity 114. In some examples, the depth of substrate cavity 114, as measured between bottom side 116 and substrate cavity floor 1141, can range from about 5% to about 40% of the thickness of substrate 11. As described in further detail below, substrate cavity 114 can provide a volume for containing a fluid, for example a test solution, a biologic sample e.g., saliva, blood, etc., a mixture of a test solutions, water, or other liquids.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, substrate 11 can be a redistribution layer ("RDL") substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, PI, BCB, or PBO. Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride ($Si3N4$), silicon oxide ($SiO2$), and/or silicon oxynitride (SiON). The inorganic dielectric layer or layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

Figure 2D:
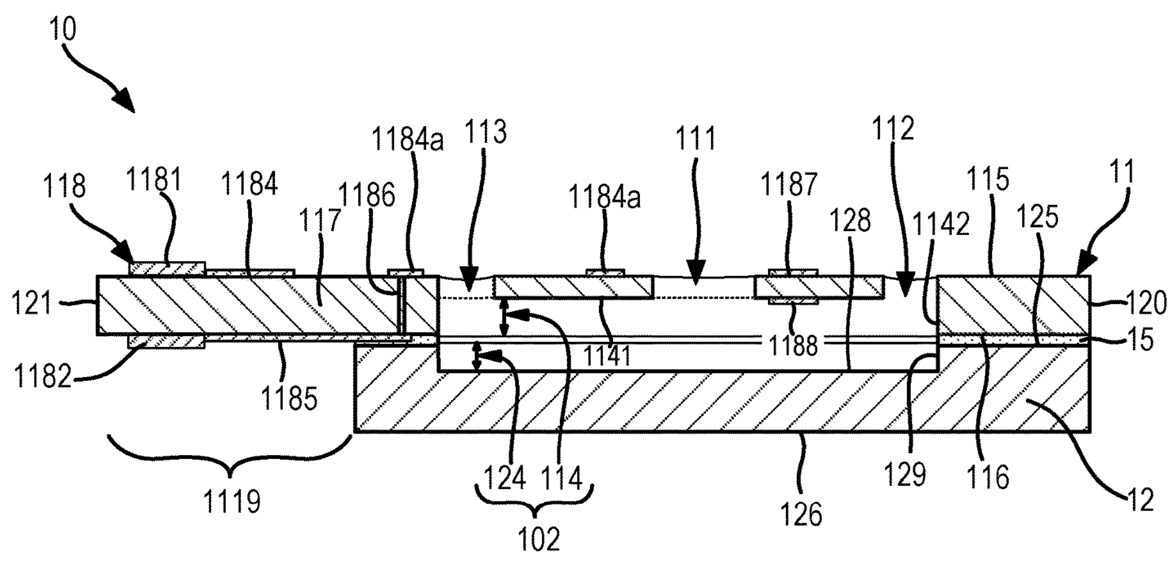
Figure 2E:
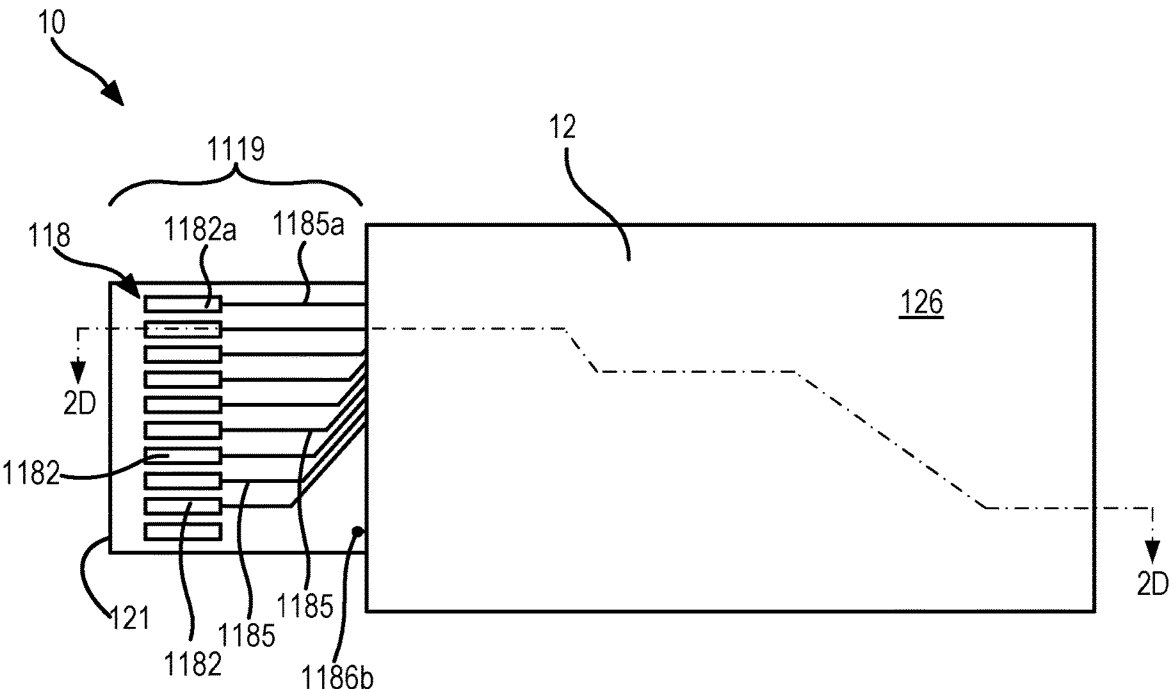

FIGS. 2D and 2E show electronic device 10 at a later stage of manufacture. FIG. 2D shows a cross-sectional view of electronic device 10 taken along the line 2D-2D in FIG. 2E. FIG. 2E shows a bottom-up view of electronic device 10. In the example shown in FIGS. 2D and 2E, base 12 can be provided on the bottom side 116 of substrate 11. In some examples, base 12 can be coupled to the bottom side 116 of substrate 11 by adhesive 15. Adhesive 15 can be provided between substrate 11 and base 12. Adhesive 15 can be provided outside substrate cavity 114 and outside base cavity 124. In some examples, adhesive 15 can contact portions of conductive structure 118. In some examples, adhesive 15 can comprise or be referred to as an interface material, an adhesive film, or an adhesive tape. In some examples, adhesive 15 can comprise a polymer adhesive, an acrylic adhesive, a vinyl alkyl ether-based adhesive, a silicone-based adhesive, a polyester-based adhesive, a polyamide-based adhesive, or a urethane-based adhesive. In some examples, the thickness of adhesive 15 can range from about 36 μm to about 44 μm.

In some examples, base 12 can comprise or be referred to as a substrate, a cavity substrate, a tape, or a plate. In some examples, base 12 can comprise a prepreg material, dielectric material such as PI, BCB, PBO, or BT, polymer, phenolic resin, epoxy, silicone, or a metallic material. Base 12 can cover aperture 111, channel openings 112 and 113, and substrate cavity 114. The area or footprint of base 12 can be smaller than the area or footprint of substrate 11. The smaller footprint of base 12 can allow, at least, a portion 1119 of substrate 11 to extend past the perimeter of base 12. In some examples, conductive structure 118 can comprise top external terminals 1181 and bottom external terminals 1182. In some examples, portion 1119 can include top external terminals 1181 on the top side of portion 1119 and bottom external terminals 1182 on the bottom side of portion 1119. At least a portion of top and bottom external terminals 1181 and 1182 can be located outside the footprint of base 12. In some examples, the bottom side of portion 1119 can be exposed adjacent to base 12. In some examples, the thickness of base 12, as measured between top base side 125 and bottom base side 126, can range from about 1500 μm to about 1700 μm. In some examples, base 12 can comprise and define base cavity 124.

Base cavity 124 can be provided in the top side 125 of base 12. Base cavity 124 can include and be defined by a base cavity floor 128 and cavity sidewalls 129. Cavity sidewalls 129 can extend from cavity floor 128 to top base side 125. In some examples, the depth of base cavity 124, as measured between top base side 125 and base cavity floor 128, can range from about 30% to about 45% of the thickness of base 12.

Base cavity 124 can extend between and fluidly connect channel opening 112, aperture 111, and channel opening 113. In some examples, the footprint of base cavity 112 can correspond to or match the footprint substrate cavity 114. A position of base cavity 124 can correspond to the position of substrate cavity 114. For example, substrate cavity 114 can be located directly over base cavity 124. Base cavity 124 and substrate cavity 114 can together provide a fluid channel 102 within electronic device 10. Fluid channel 102 can be defined by substrate cavity floor 1141, sidewalls 1142, base cavity floor 128, cavity sidewalls 129, and adhesive 15. In some examples, fluid channel 102 can be employed as a volume in which fluid, for example a test solution, a mixture of test solution and a biologic sample, a test water, or other liquids, can be located. Fluid channel 102 is fluidly connected to vias 113 as shown in FIG. 1A by aperture 111. Fluid channel 102 is fluidly connected to top side 115 of substrate 11 by channel openings 112 and 113. In some examples, the fluid in fluid channel 102 can be coupled to conductive structure 118 of substrate 11. For example, fluid located in fluid channel 102 can be coupled to bottom solution electrode 1188 of conductive structure 118. In some examples, a portion of bottom solution electrode 1188 can be exposed within fluid channel 102, such that liquid in fluid channel 102 can directly contact bottom solution electrode 1188.

Figure 2F:
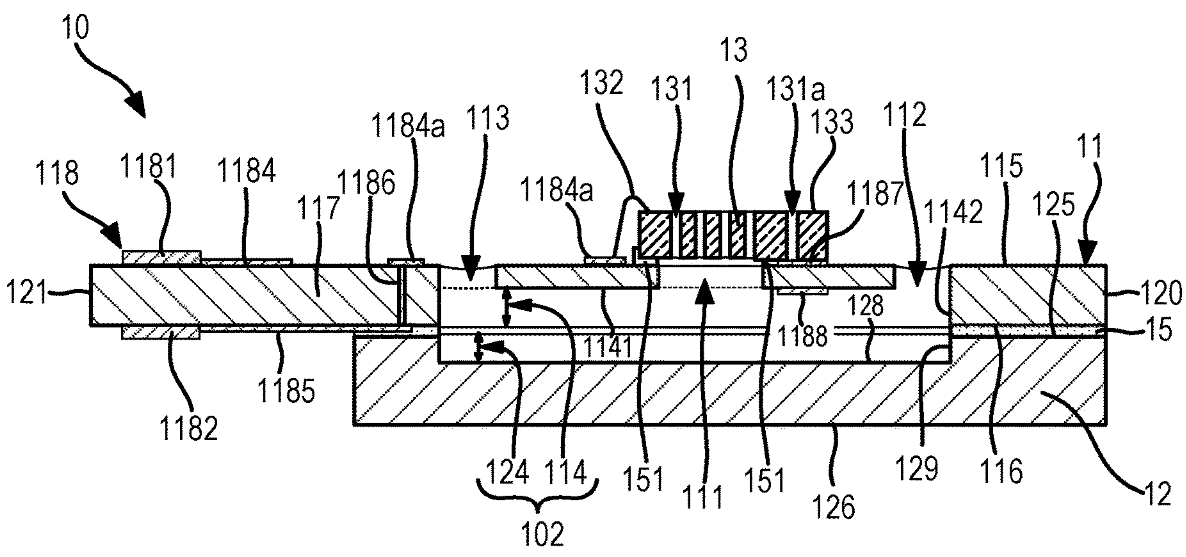
Figure 2G:
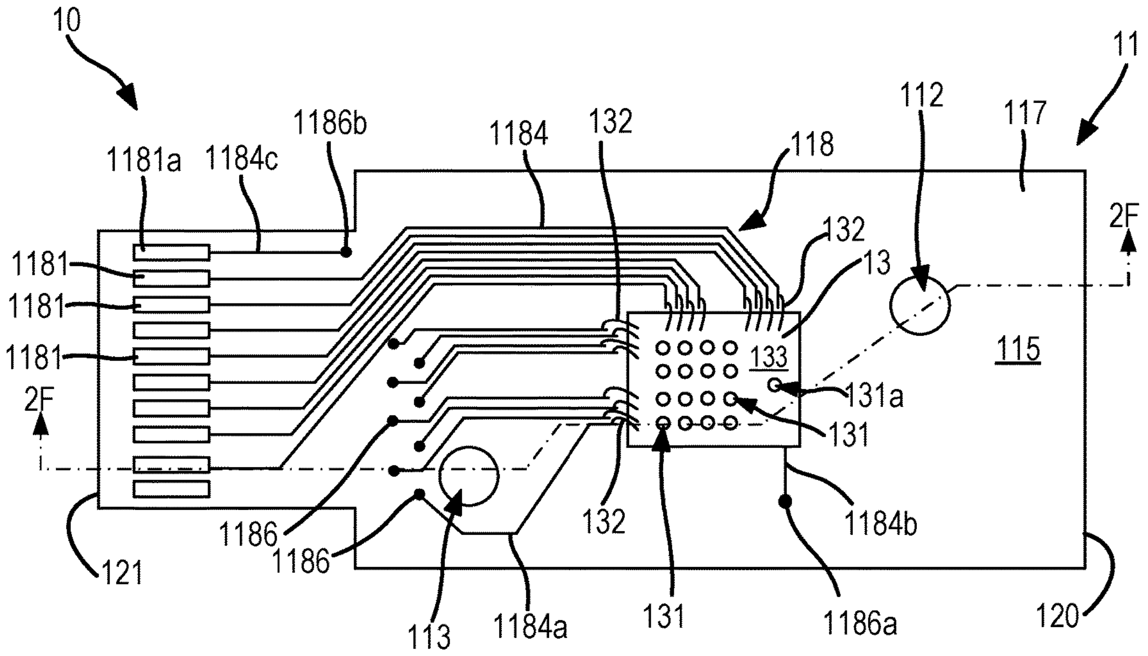

FIGS. 2F and 2G show electronic device 10 at a later stage of manufacture. FIG. 2F shows a cross-sectional view of electronic device 10 taken along the line 2F-2F in FIG. 2G. FIG. 2G shows a top-down view of electronic device 10. In the example shown in FIGS. 2F and 2G, electronic component 13 can be provided on top surface 115 of substrate 11. Electronic component 13 can be located over and cover aperture 111 of substrate 11. The area or footprint of electronic component 13 can be larger than the area or footprint of aperture 111. In some examples, electronic component 13 can be located between channel opening 112 and channel opening 113. Electronic component 13 can comprise vias 131, and component interconnects 132 can couple electronic component 13 to conductive structure 118.

In some examples, electronic component 13 can comprise or be referred to as one or more dies, chips, or packages. In some examples, electronic component 13 can comprise a semiconductor package, such as a semiconductor die, a semiconductor chip, or a chip scale package. In some examples, electronic component 13 can comprise a memory, a digital signal processor (DSP), a microprocessor, a network processor, a power management processor, a radio-frequency (RF) circuit, a wireless baseband system-on-chip (SoC) processor, a sensor, or an electrical circuit such as an application specific integrated circuit (ASIC). In some examples, the height of electronic component 13 can range from about 390 μm to about 410 μm.

In some examples, vias 131 can comprise or be referred to as fluid passageways or nano-poles. One or more vias 131 can extend completely through electronic component 13. The location of one or more of the vias 131 can correspond to the location of aperture 111, such that vias 131 are located directly over aperture 111. In some examples, aperture 111 exposes fluid channel 102 below electronic component 13. Aperture 111 can be between vias 131 and fluid channel 102. In various examples, electronic component 13 can include one or more vias **131*a* coupled to top fluid terminal 1187. Vias 131*a* can extend completely through electronic component 13 and can be over top fluid terminal 1187 wherein top fluid terminal 1187 is exposed through one or more vias 131*a*. The location of vias 131*a* can correspond to the location of top side fluid terminal 1187, such that vias 131*a* can be located directly over top solution terminal 1187. In some examples, the diameter of each via 131 and via 131*a* can range from about 39 μm to about 41 μm, and the pitch of vias 131 or 131*a*** can range from about 110 μm to about 130 μm.

In some examples, vias 131 can provide a fluid path between a top side 133 of electronic component 13 and aperture 111. For example, fluid, for example a test solution, a biologic sample, a mixture test solution and biologic sample, or other liquid, located on top side 133 of electronic component 13 can flow into aperture 111 and fluid path 102 through vias 131. In some examples, vias **131*a* can provide a fluid path between top side 133 of electronic component 13 and top solution terminal 1187. For example, fluid, for example a test solution, a biologic sample, a mixture test solution and biologic sample, or other liquid, located on top side 133 of electronic component 13 can flow through vias 131*a* and contact top solution terminal 1187. In some examples, the fluid flowing through vias 131 and aperture 111 such as the fluid deposited over top side 133 can mix with other fluid located in fluid channel 102, for example with fluid injected through channel opening 112 or channel opening 113. The mixture of the fluid in fluid channel 102 such as the fluid deposited on top side 133 and the fluid deposited through fluid channel 112 or 113 can contact bottom solution terminal 1188. In some examples, the signal output by top solution terminal 1187 can correspond to the fluid deposited over top side 133 of electronic component 13, while the signal output by bottom solution terminal 1188 can correspond to the mixture of the fluid deposited over top side 133 of electronic component 13 and the fluid deposited through fluid channel 112 or fluid channel 113**.

In some examples, component interconnects 132 can comprise or be referred to as wires, conductive wires, wirebonds, or bumps. Component interconnect 132 can couple electronic component 13 and substrate 11. In some examples, component interconnects 132 can be coupled to conductive structure 118 of substrate 11. In some examples, a first group of component interconnects 132 can be coupled to top traces 1184 and a second group of component interconnects 132 can be coupled to top traces **1184*a*. In some examples, component interconnects 132** can comprise gold, silver, platinum, gold/tin, aluminum, nickel, palladium, nickel-palladium, titanium, tungsten, or titanium-tungsten.

In some examples, electronic component 13 can be attached to substrate 11 through a die adhesive 151. Die adhesive 151 can be similar to adhesive 15, described above with reference to FIGS. 2D and 2E. Die adhesive 151 can be provided between electronic component 13 and top side 115 of substrate 11. Die adhesive 151 can be located outside aperture 111. In some examples, a portion of die adhesive 151 can extend to cover a portion of the lateral sides of electronic component 13. In some examples, die adhesive 151 can contact portions of conductive structure 118. At least a portion of top solution terminal 1187 is exposed from die adhesive 151, such that liquid deposited in via 131*a* can flow to and contact top solution terminal 1187.

Figure 2H:
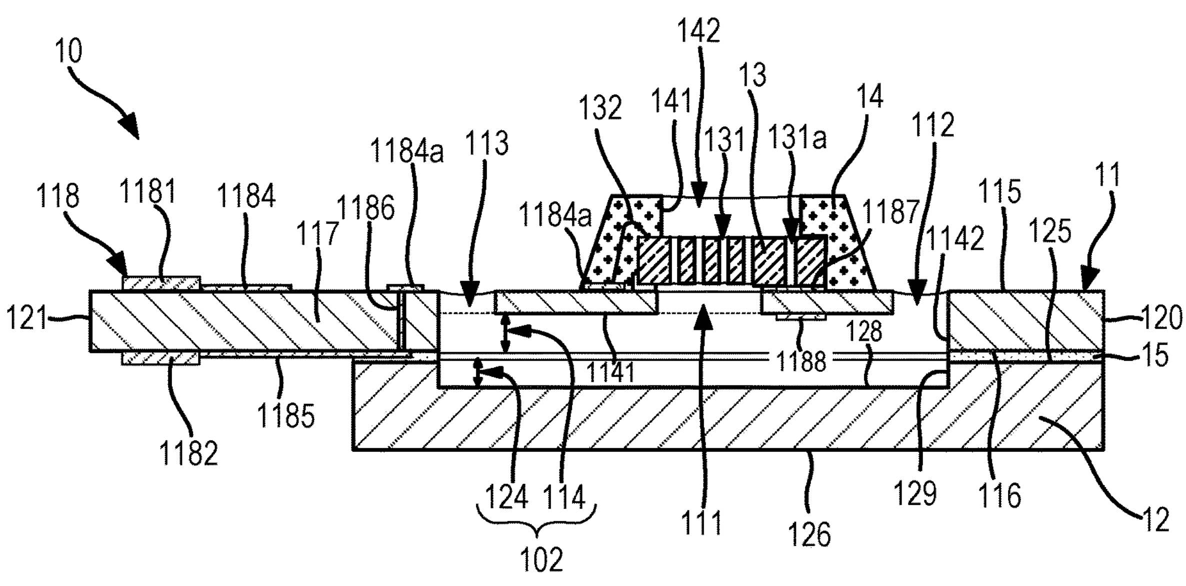
Figure 2I:
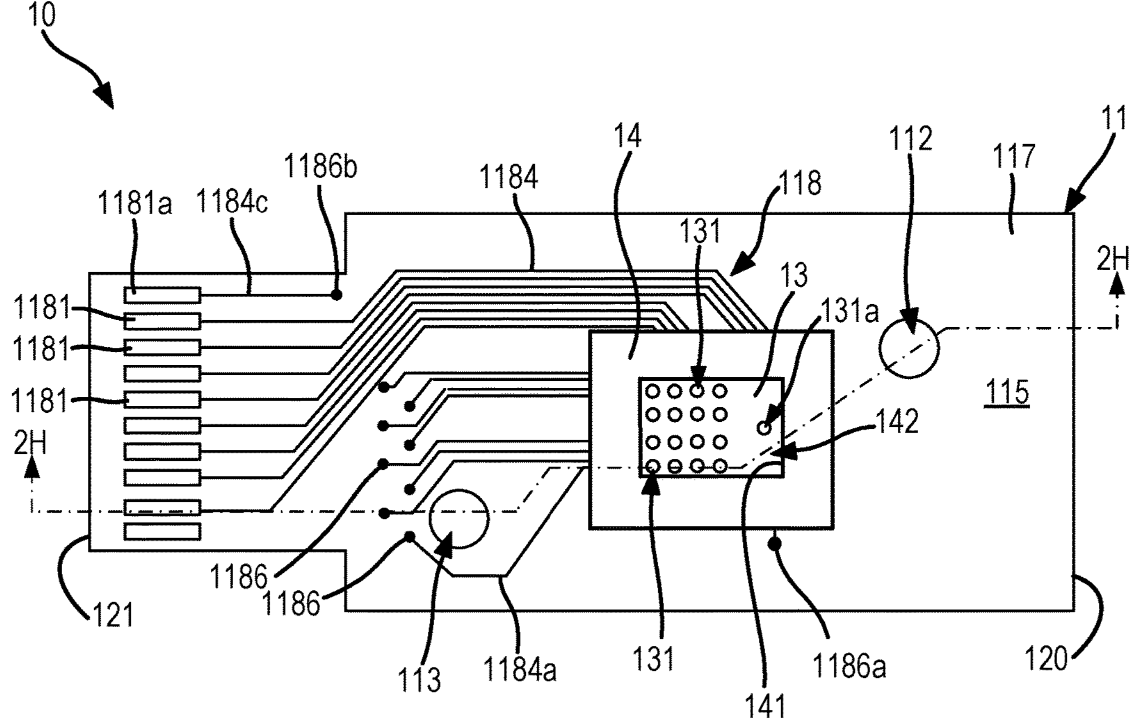

FIGS. 2H and 2I show electronic device 10 at a later stage of manufacture. FIG. 2H shows a cross-sectional view of electronic device 10 taken along the line 2H-2H in FIG. 2I. FIG. 2I shows a top-down view of electronic device 10. In the example shown in FIGS. 2H and 2I, funnel 14 can be provided on substrate 11. In some examples, funnel 14 can comprise or be referred to as a mold compound, an epoxy mold compound, a polymer, or a resin. In some examples, funnel 14 can comprise a polymer composite material with inorganic filler, an epoxy resin, an epoxy acrylate, or a silicone resin. Funnel 14 can be located over and cover a portion of the substrate 11 or a portion of electronic component 13. Funnel 14 can be provided to cover one or more lateral sides of electronic component 13. Funnel 14 can cover and surround component interconnects 132. Funnel 14 can cover a portion of the top side 133 of electronic component 13. Vias 131 and 131*a* are exposed from funnel 14. For example, funnel 14 can include and define a funnel opening 142. Funnel opening 142 can be located over vias 131 and 131*a*.

Figure 4A:
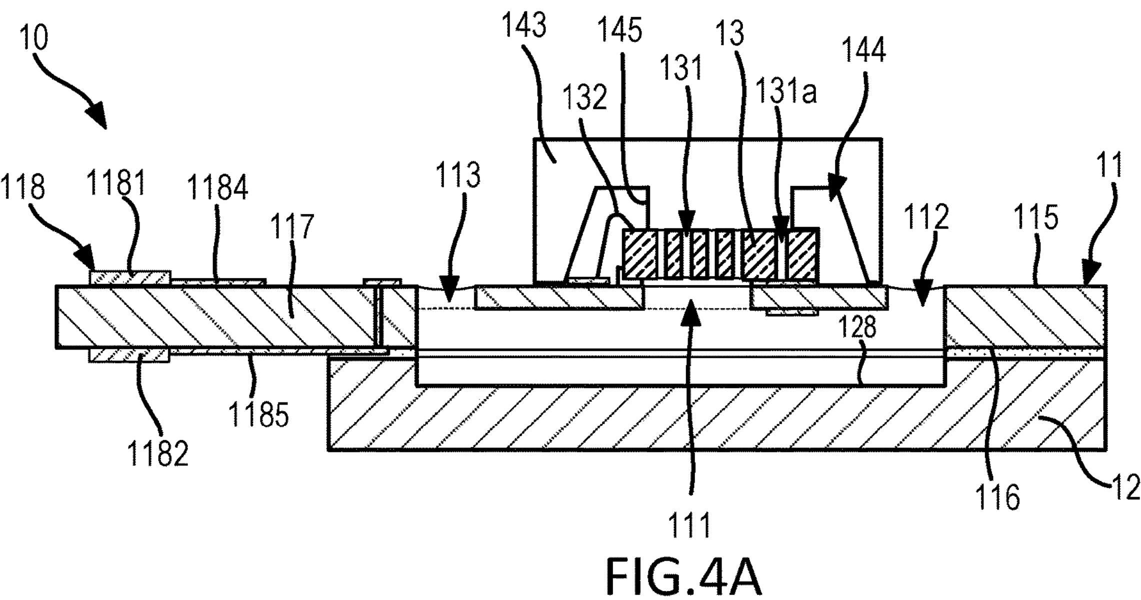
FIGS. 4A to 4C show cross-sectional views of an example method for forming a funnel.
Figure 4B:
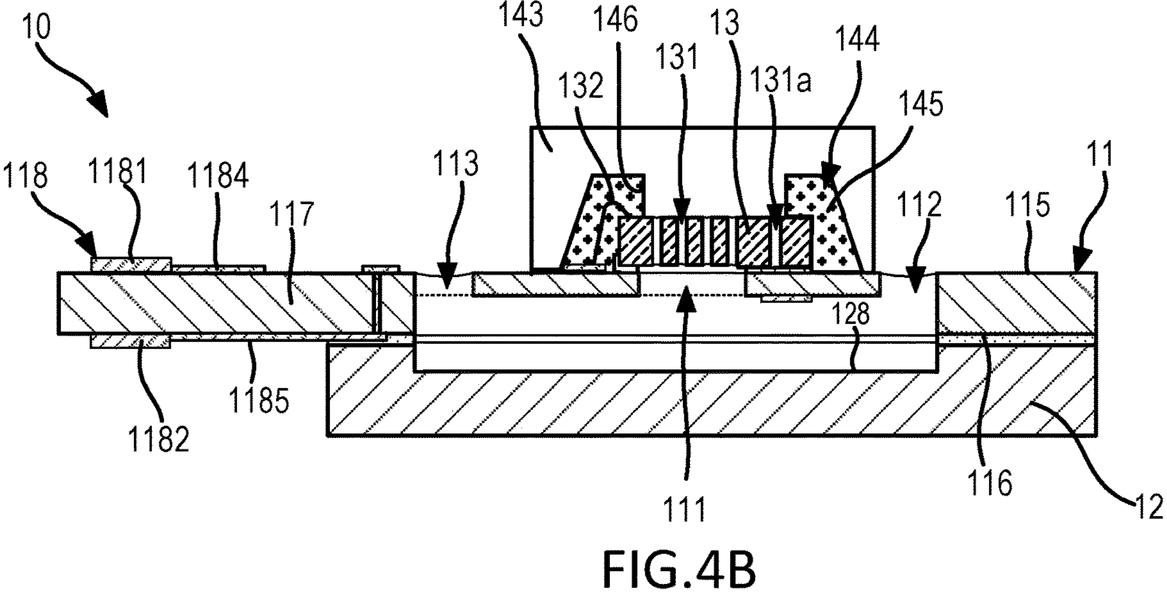
Figure 4C:
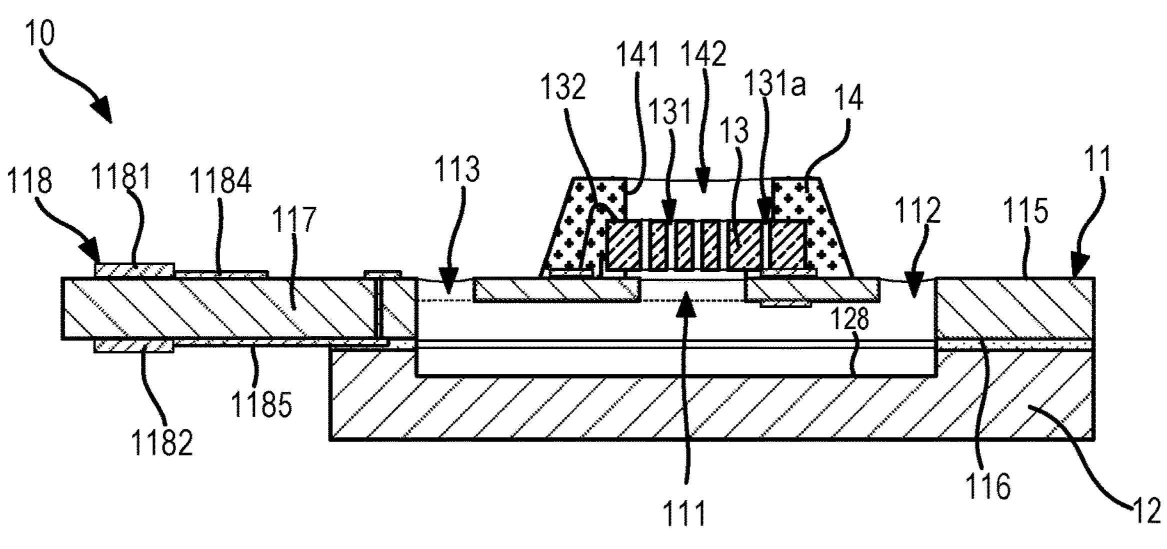

In some examples, funnel 14 can be provided over electronic component 13 using a mold tool configured to form funnel opening 142. For example, and with momentary reference to FIG. 4A, mold tool 143 be located over electronic component 13 and top side 115 of substrate 11. Mold tool 143 can include and define a mold cavity 144. The shape of mold cavity 144 can correspond to the final shape of funnel 14 as shown in FIG. 4C. With reference to FIG. 4B, the mold compound 145 can be deposited in mold cavity 144. Mold wall 146 can define mold cavity 144 and can block or prevent mold compound 145 from flowing over vias 131, 131*a*. In this regard, mold tool 143, including mold cavity 144, can be configured to form funnel opening 142 as shown in FIG. 4C. With reference to FIG. 4C, after curing, mold tool 143 can be removed, leaving funnel 14 formed over interconnects 132, electronic component 13, and substrate 11 and funnel opening 142 located over vias 131, 131*a*. In some examples, mold compound 145 contacts a lateral side of electronic component 13, and a portion of component interconnect can be in the mold compound 145.

Figure 5A:
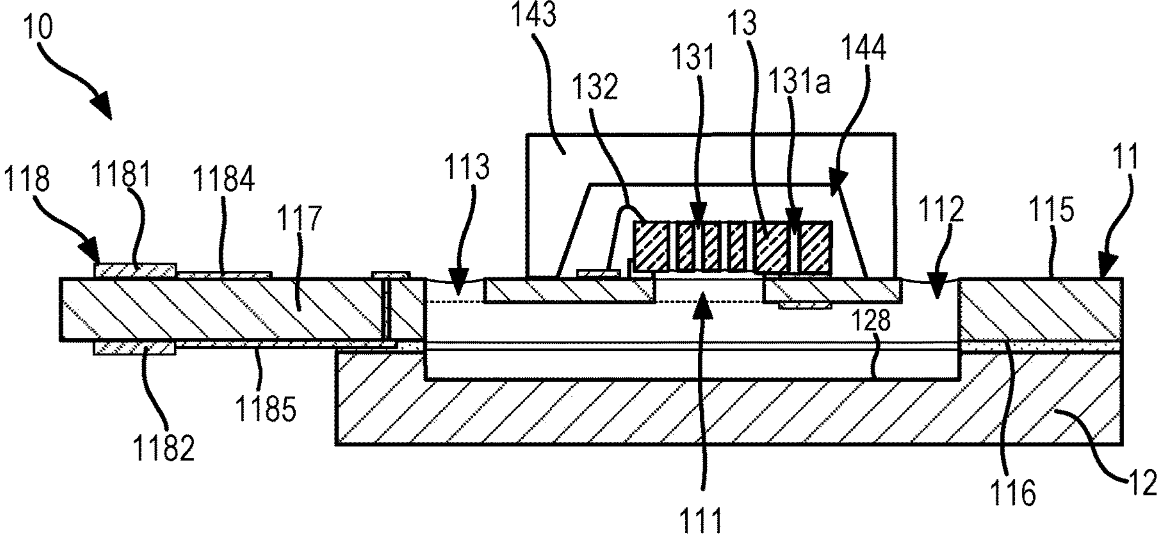
FIGS. 5A to 5C show cross-sectional views of an example method for forming a funnel.
Figures 5B, 5C:
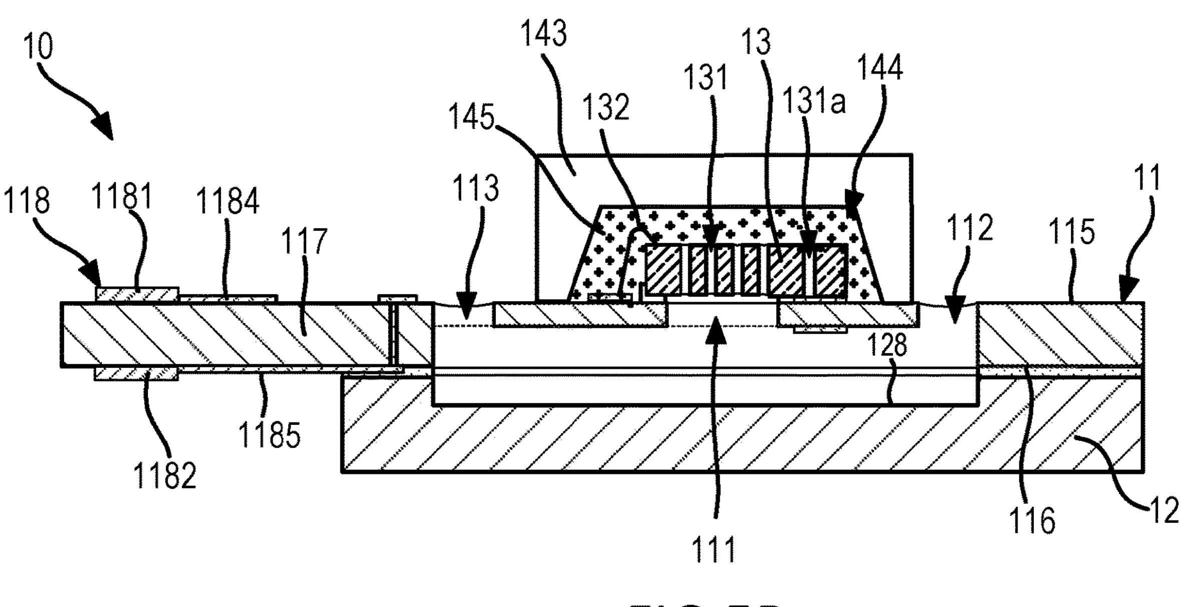

In some examples, funnel 14 can be provided over electronic component 13 by over-molding, for example covering, the top side 133 of electronic component 13 with the mold compound and then removing a portion of the mold compound, for example with a laser, to form funnel opening 142. For example, and with reference to FIG. 5A, mold tool 143 can be located over electronic component 13 and top side 115 of substrate 11. Mold tool 143 can include and define a mold cavity 144, which can extend over, or overlap, vias 131 and 131*a*. With reference to FIG. 5B, mold compound 145 can be deposited in mold cavity 144. In some examples, mold compound 145 can cover top side 133 of electric component 13. With reference to FIG. 5C, after curing, mold tool 143 can be removed and funnel opening 142 can be formed by removing a portion of mold compound 145. For example, laser 147 can form funnel opening 142. In some examples, the height of funnel 14 can range from about 500 μm to about 600 μm. The height of funnel 14 is measured from the top side 115 of substrate 11.

Returning to FIGS. 2H and 2I, funnel 14 can comprise funnel sidewall 141. Funnel sidewall 141 can refer to an inner sidewall of funnel 14. Funnel sidewall 141 defines funnel opening 142. Funnel sidewall 141 can be positioned on electronic component 13 and can be provided outside vias 131 and 131*a*. In some examples, funnel sidewall 141 can be provided between vias 131 and 131*a* and component interconnects 132. In some examples, the space surrounded by funnel sidewall 141 defining funnel opening 142 can be provided to contain fluid, for example a test solution, a biologic sample, or a mixture of a test solution and biologic sample, or any other liquid, deposited on top side 133 of electronic component 13. For example, funnel sidewall 141 can prevent the liquid deposited on electronic component 13 from flowing to a lateral side of electronic component 13. In some examples, the height of funnel sidewall 141 can range from about 100 μm to about 200 μm. The height of funnel sidewall 141 is measured from the top side 133 of electronic component 13.

Figure 3:
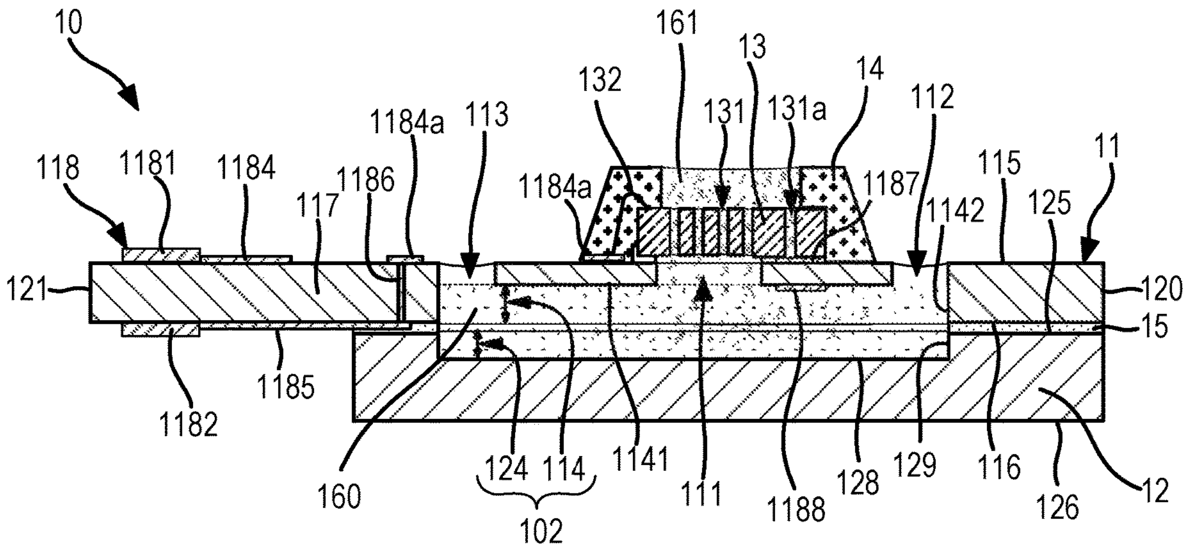
FIG. 3 shows a cross-section view of an example electronic device having test fluids deposited therein.

Referring to FIG. 3, in accordance with the various examples disclosed herein, first fluid 160, for example a test water, can be deposited into fluid channel 102 via channel opening 102 or 103. Second fluid 161, for example a test solution and biologic sample, can be deposited on electronic component 13. Second fluid 161 can flow through vias 131 and aperture 111 and into fluid channel 102. First fluid 160 and second fluid 161 can combine within fluid channel 102. The combination of first fluid 160 and second fluid 161 can contact bottom fluid terminal 1188. A portion of second fluid 161 can flow through via 131*a* and contact top fluid terminal 1187.

Figures 6, 7:
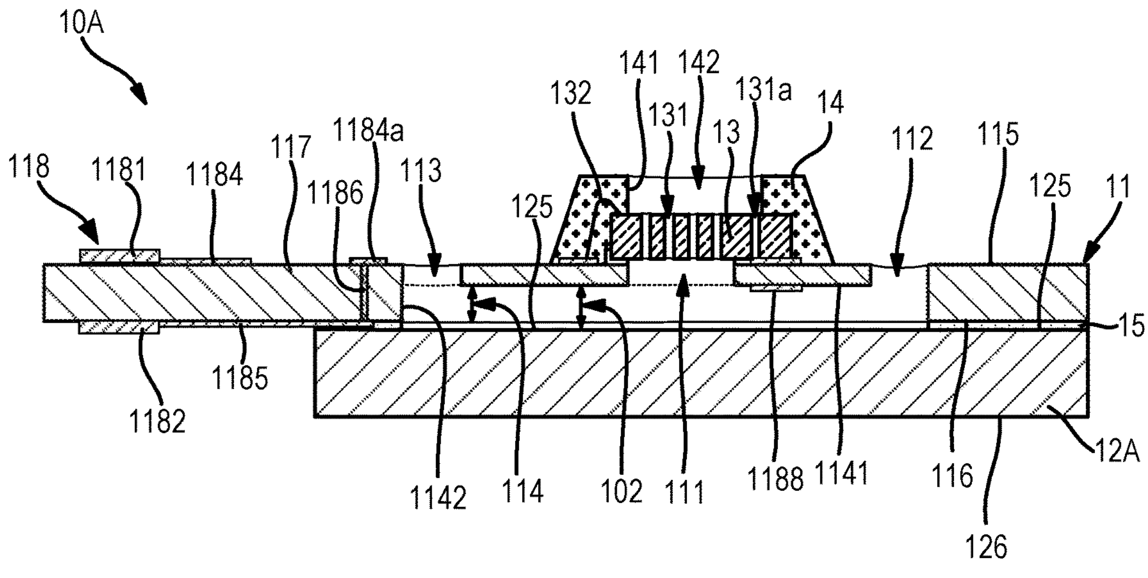
FIG. 6 shows a cross-sectional view of an example electronic device.
FIG. 7 shows a cross-sectional view of an example electronic device.

FIG. 6 shows a cross-sectional view an example electronic device 10A. In the example shown in FIG. 6, electronic device 10A can comprise substrate 11, base 12A, electronic component 13, funnel 14, and adhesive 15. In some examples, electronic device 10A can comprise elements, features, materials, or formation processes similar to those of electronic device 10 previously described. In the present example, base 12A need not comprise a base cavity like base cavity 124 of base 12 in FIGS. 1A to 2I. In the present example, substrate cavity 114 can form fluid channel 102. For example, in electronic device 10A, fluid channel 102 can extend from substrate cavity floor 1141 to top base surface 125 and can be defined by substrate cavity floor 1141, sidewalls 1142, top base surface 125, and adhesive 15.

FIG. 7 shows a cross-sectional view an example electronic device 10B. In the example shown in FIG. 7, electronic device 10B can comprise substrate 11B, base 12, electronic component 13, funnel 14, and adhesive 15. In some examples, electronic device 10B can comprise similar elements, features, materials, or formation processes to those of electronic device 10 previously described. In the present example, substrate 11B need not comprise a substrate cavity like substrate cavity 114 of substrate 11 in FIGS. 1A to 2I. In the present example, base cavity 124 can form fluid channel 102. For example, in electronic device 10B, fluid channel 102 can extend from base cavity floor 128 to bottom side 116 of substrate 11 and can be defined by base cavity floor 128, cavity sidewalls 129, bottom side 116, and adhesive 15.

Figure 8A:
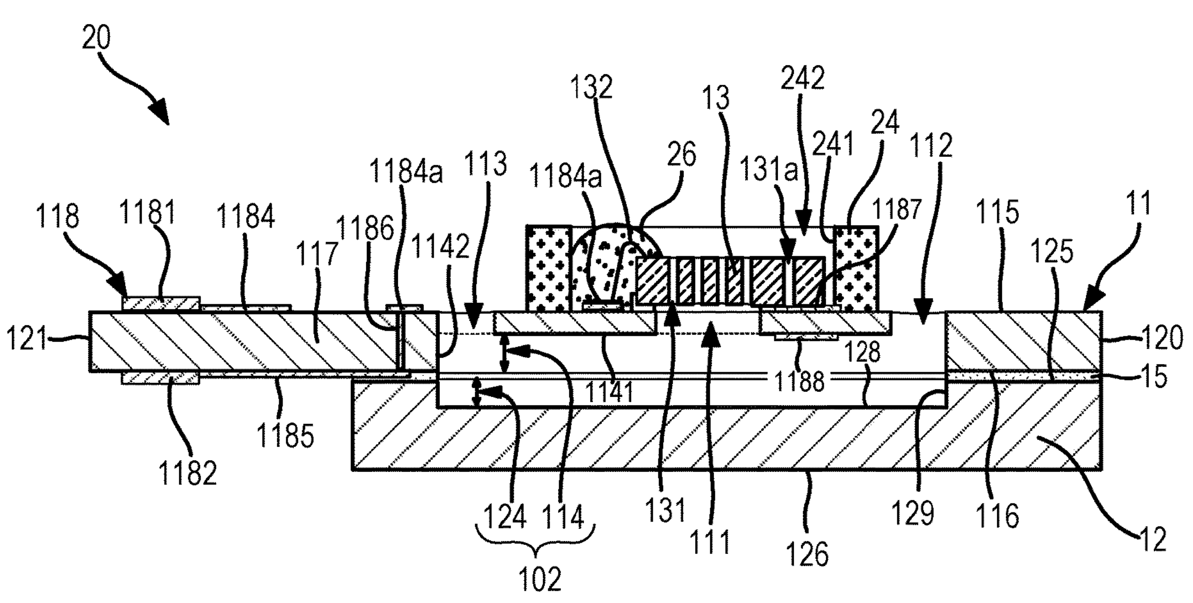
FIGS. 8A and 8B show a cross-sectional view and a top view, respectively, of an example electronic device.
Figure 8B:
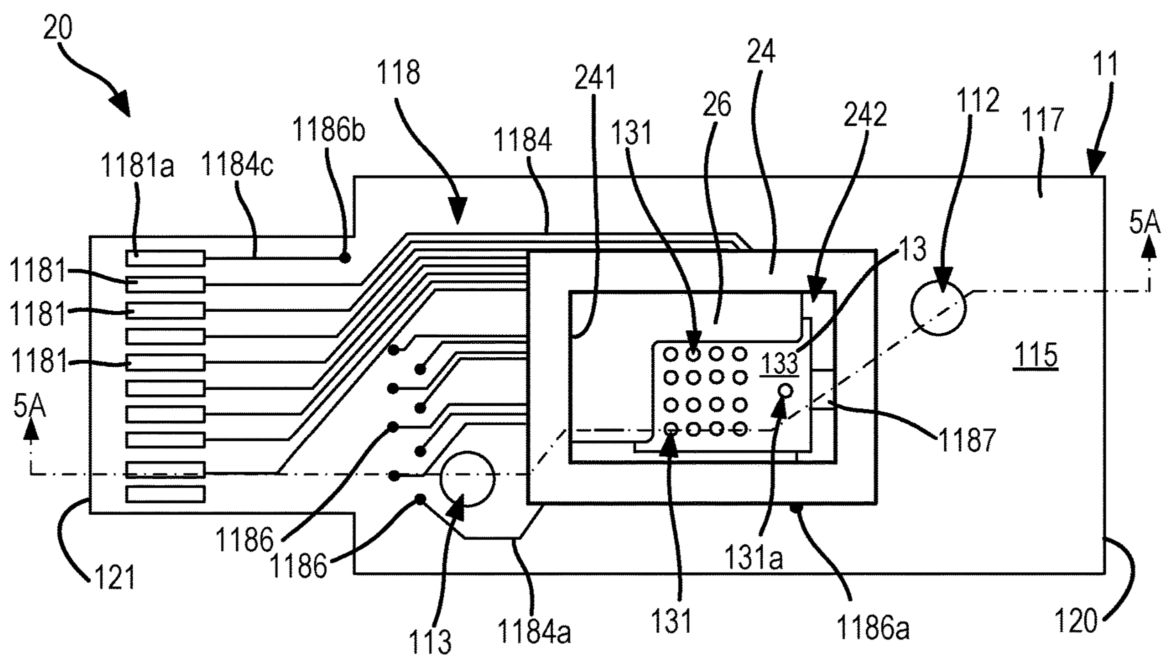

FIGS. 8A and 8B show a cross-sectional view and a top-down view, respectively, of an example electronic device. In the example shown in FIGS. 8A and 8B, electronic device 20 can comprise substrate 11, base 12, electronic component 13, funnel 24, adhesive 15, and encapsulant 26. Funnel 24 can comprise funnel sidewall 241 and funnel opening 242. In some examples, electronic device 20 can comprise elements, features, materials, or formation processes similar to those of electronic device 10 previously described. In some examples, funnel 24 can be spaced apart from a lateral side of electronic component 13. In some examples, encapsulant 26 can be in funnel opening 242 and can contact a lateral side of electronic component 13 or a top side of electronic component 13. In some examples, encapsulant 26 can contact funnel sidewall 241. In some examples, a portion of component interconnect 132 can be the encapsulant 26. The cross-sectional view of FIGS. 8A and 9A to 9C is taken along the line 8A-8A in FIG. 8B.

Figure 9A:
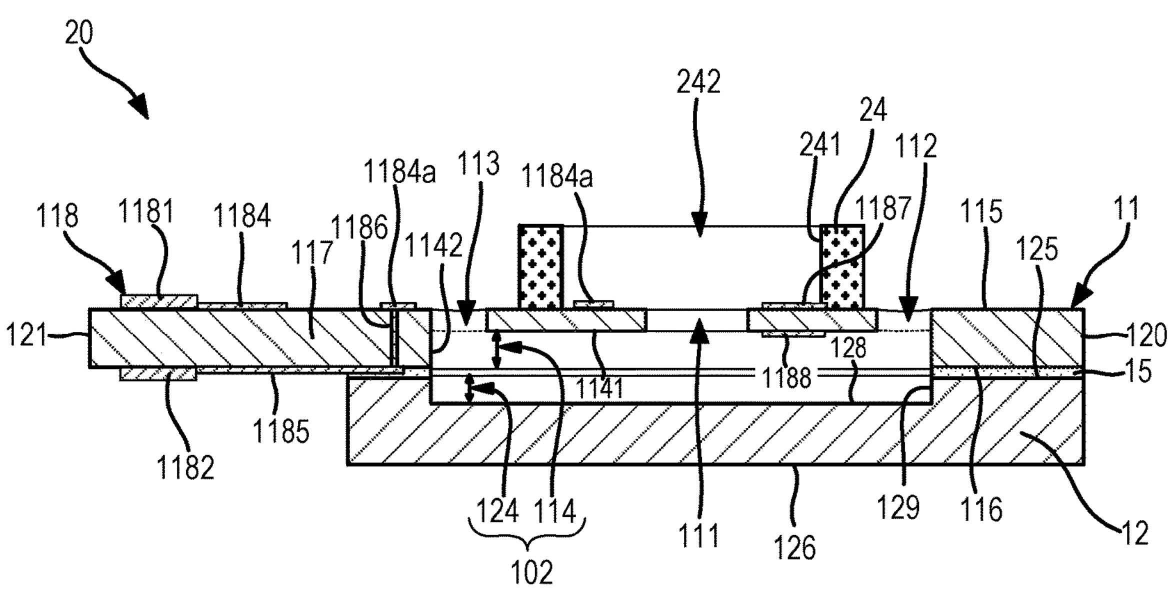
FIGS. 9A to 9C show cross-sectional views of an example method for manufacturing an example electronic device.
Figure 9B:
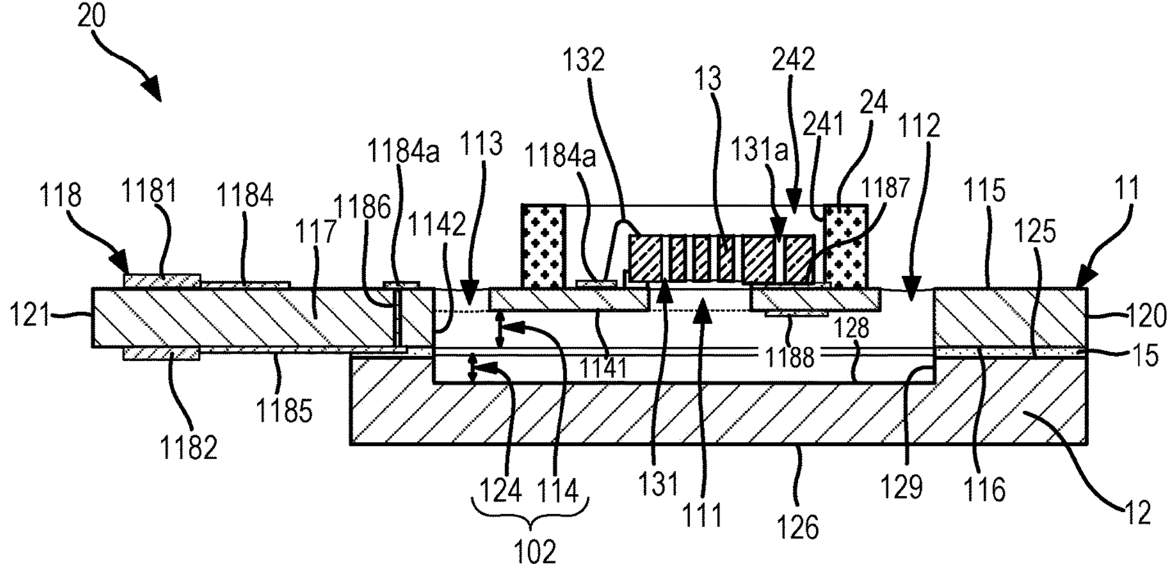
Figures 9C, 10:
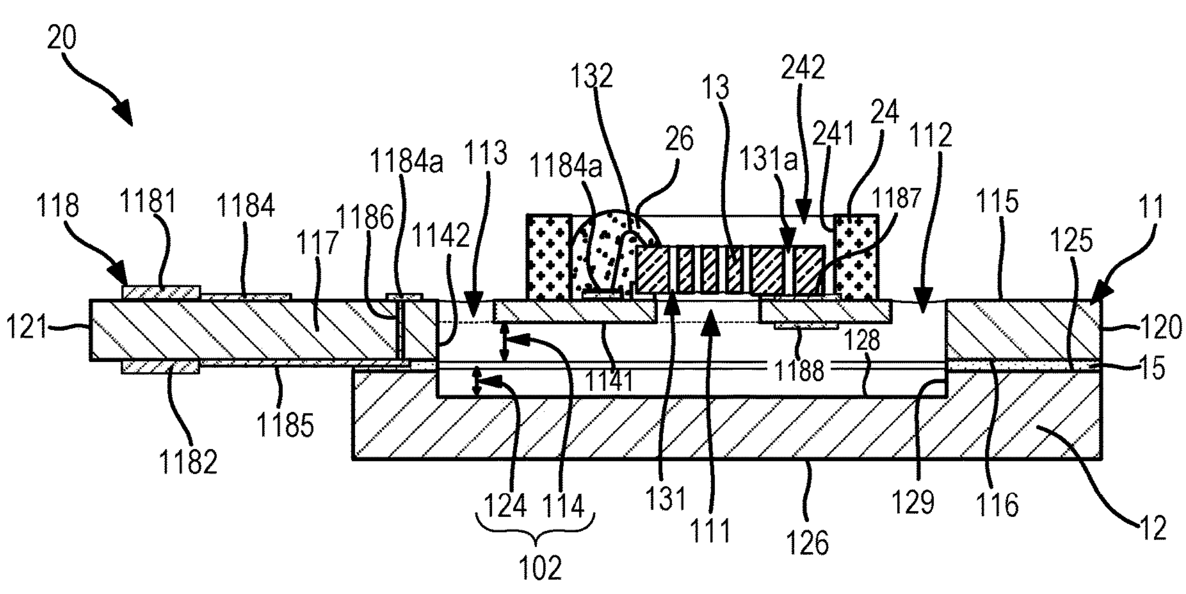
FIG. 10 shows a cross-sectional view of an example electronic device.

FIGS. 9A to 9C show cross-sectional views of an example method for manufacturing an example electronic device. FIG. 9A shows a cross-sectional view of electronic device 20 at an early stage of manufacture. In the example shown in FIG. 8A, the steps described with respect to FIGS. 2A to 2E can be followed, and then funnel 24 can be provided on top side 115 of substrate 11. In some examples, funnel 24 can be provided on top side 115 of substrate 11 using a mold tool configured to form funnel opening 242. For example, the mold tool can block or prevent the mold compound from flowing over the area corresponding to funnel opening 242. For example, in some examples, funnel 24 can comprise a formation process similar to funnel 14, as described above with reference to FIGS. 4A to 4C. In some examples, funnel 24 can comprise or be referred to as a mold compound, an epoxy mold compound, a polymer, or a resin. In some examples, funnel 24 can comprise a polymer composite material, an epoxy resin, an epoxy acrylate, or a silicone resin. Funnel 24 can be located over and cover a portion of the substrate 11. Funnel 24 can include and define a funnel opening 242.

Funnel 24 can be provided outside a perimeter of aperture 111 and can surround aperture 111. Funnel 24 can be located between aperture 111 and channel opening 112 and between aperture 111 and channel opening 113. Funnel opening 242 can be located directly over aperture 111. In some examples, funnel 24 can cover portions of conductive structure 118. At least a portion of top solution terminal 1187 is exposed from funnel 24. Funnel 24 can comprise funnel sidewall 241. Funnel sidewall 241 can refer to an inner sidewall of funnel 24. Funnel sidewall 241 defines funnel opening 242. In some examples, the height of funnel sidewall 241 can range from about 500 μm to about 600 μm. The height of funnel sidewall 241 is measured from upper side 115 of substrate 11.

FIG. 9B shows a cross-sectional view of electronic device 20 at a later stage of manufacture. In the example shown in FIG. 9B, electronic component 13 can be provided on substrate 11. Electronic component 13 can be provided inside funnel 24 and can cover aperture 111. Electronic component 13 can be spaced apart from funnel 24, such that the lateral sides of electronic component 13 are spaced apart from funnel sidewall 241. In some examples, a portion of top solution terminal 1187 can be exposed in the space between electronic component 13 and funnel sidewall 241. Component interconnects 132 can be spaced apart from funnel sidewall 241. In some examples, the height of component interconnect 132, as measured from upper side 115, can be smaller than the height of funnel 24.

FIG. 9C shows a cross-sectional view of electronic device 20 at a later stage of manufacture. In the example shown in FIG. 9C, encapsulant 26 can be provided. Encapsulant 26 can encapsulate, for example surround, component interconnects 132. Encapsulant 26 can be provided between electronic component 13 and funnel 24. In some examples, encapsulant 26 can contact one or more lateral sides of electronic component 13, funnel sidewall 241, and the top side 115 of substrate 11. Encapsulant 26 can be formed on electronic component 13. For example, encapsulant 26 can cover a portion of the upper side 133 of electronic component 13. Encapsulant 26 can be provided outside of vias 131 and 131*a*, such that vias 131 and 131*a* are exposed from encapsulant 26. In some examples, encapsulant 26 can comprise or be referred to as a protective material or a resin. In some examples, encapsulant 26 can be provided by a liquid phase encapsulant molding process. Encapsulant 26 can protect component interconnects 132 from exposure to external elements or environment. In some examples, the space surrounded by funnel sidewall 241 defining funnel opening 142 can be provided to contain fluid, for example a test solution, a biologic sample, or a mixture of a test solution and biologic sample, or any other liquid, deposited on top side 133 of electronic component 13.

FIG. 10 shows a cross-sectional view an example electronic device 20A. In the example shown in FIG. 10, electronic device 20A can comprise substrate 11, base 12A, electronic component 13, funnel 24, encapsulant 26, and adhesive 15. In some examples, electronic device 20A can comprise elements, features, materials, or formation processes similar to those of electronic device 20 previously described. In the present example, base 12A need not comprise a base cavity, similar to base 12A in FIG. 6. In the present example, substrate cavity 114 can form fluid channel 102. For example, fluid channel 102 can extend from substrate cavity floor 1141 to upper base surface 125 and can be defined by substrate cavity floor 1141, sidewalls 1142, upper base surface 125, and adhesive 15.

Figure 11:
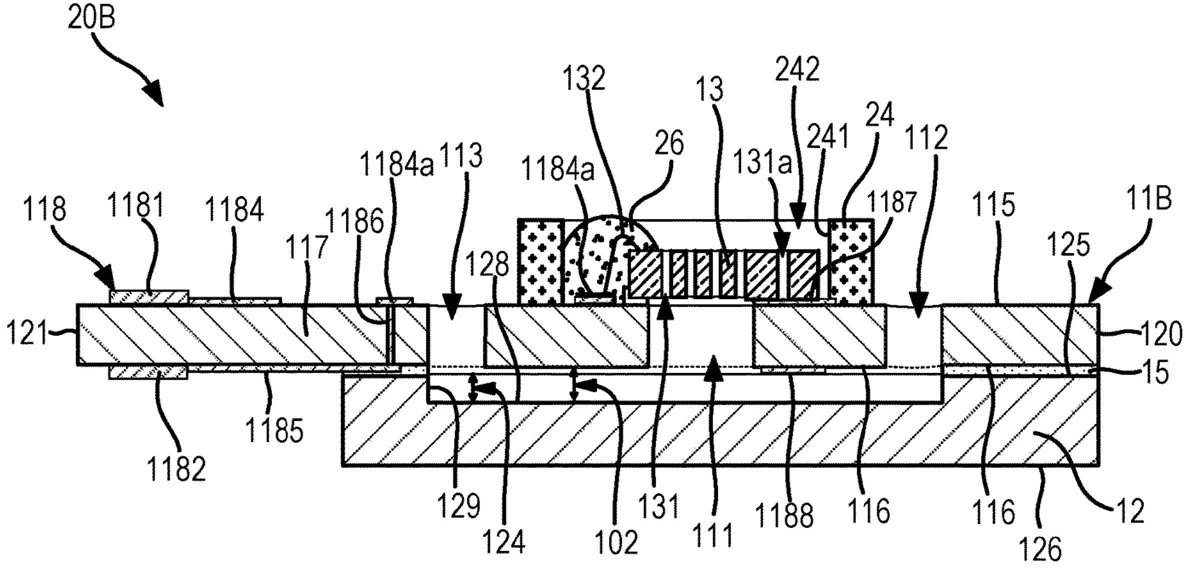
FIG. 11 shows a cross-sectional view of an example electronic device.

FIG. 11 shows a cross-sectional view an example electronic device 20B. In the example shown in FIG. 11, electronic device 20B can comprise substrate 11B, base 12, electronic component 13, funnel 24, encapsulant 26, and adhesive 15. In some examples, electronic device 20B can comprise elements, features, materials, or formation processes similar to those of electronic device 20 previously described. In the present example, substrate 11B need not comprise a substrate cavity, similar to substrate 11B in FIG. 7. In the present example, base cavity 124 can form fluid channel 102. For example, fluid channel 102 can extend from base cavity floor 128 to bottom side 116 of substrate 11, and can be defined by substrate cavity floor 128, cavity sidewalls 129, bottom side 116, and adhesive 15.

The present disclosure includes reference to certain examples. It will be understood by those skilled in the art, however, that various changes may be made, and equivalents may be substituted without departing from the scope of the disclosure. In addition, modifications can be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:

a base;

a substrate over the base and comprising a top side, a bottom side, and a conductive structure, wherein the substrate further comprises a channel opening and an aperture, and wherein the bottom side of the substrate is oriented toward the base;

an electronic component over the top side of the substrate and over the aperture, wherein the electronic component is coupled with the conductive structure; and a funnel over the top side of the substrate and comprising a funnel opening, wherein a top side of the electronic component is exposed through the funnel opening.

2. The electronic device of claim 1, wherein:

the conductive structure comprises a top fluid terminal on the top side of the substrate; and the electronic component comprises a via over the top fluid terminal and extending through the electronic component, wherein the top fluid terminal is exposed through the via.

3. The electronic device of claim 1, wherein:

the electronic component comprises a via extending through the electronic component;

the aperture exposes a fluid channel below the electronic component; and the aperture is between the via and the fluid channel.

4. The electronic device of claim 3, wherein:

the channel opening extends from the top side of the substrate to the fluid channel.

5. The electronic device of claim 3, wherein:

the fluid channel comprises a substrate cavity in the substrate.

6. The electronic device of claim 3, wherein:

the fluid channel comprises a base cavity in the base.

7. The electronic device of claim 3, further comprising:

a bottom fluid terminal on the bottom side of the substrate in the fluid channel.

8. The electronic device of claim 1, wherein:

a first portion of the substrate extends beyond a lateral side of the base; and the conductive structure comprises top external terminals on the top side of the substrate on the first portion of the substrate and bottom external terminals on the bottom side of the substrate on the first portion of the substrate.

9. The electronic device of claim 1, wherein:

the funnel comprises mold compound; and the funnel is spaced apart from a lateral side of the electronic component.

10. The electronic device of claim 1, further comprising:

a component interconnect coupling the electronic component to the substrate.

11. The electronic device of claim 10, wherein:

the funnel comprises mold compound contacting a lateral side of the electronic component; and a portion of the component interconnect is in the mold compound.

12. The electronic device of claim 10, further comprising:

an encapsulant in the funnel opening and contacting a lateral side of the electronic component, wherein a portion of the component interconnect is in the encapsulant.

13. The electronic device of claim 12, wherein:

the encapsulant contacts the top side of the electronic component and a sidewall of the funnel.

14. An electronic package, comprising:

a substrate comprising a conductive structure, a top side, and a bottom side;

a base coupled with the bottom side of the substrate;

an electronic component over the top side of the substrate and coupled with the conductive structure, wherein the electronic component comprises a plurality of vias extending through the electronic component; and a funnel over the top side of the substrate and surrounding the electronic component;

wherein:

a fluid channel is defined in at least one of the substrate or the base; and the substrate comprises a channel opening extending from the top side of the substrate to the bottom side of the substrate and to the fluid channel.

15. The electronic package of claim 14, wherein:

a first portion of the bottom side of the substrate is exposed adjacent to the base.

16. The electronic package of claim 15, wherein:

the conductive structure comprises a bottom external terminal on the first portion of the bottom side of the substrate.

17. The electronic package of claim 15, wherein the conductive structure comprises:

a top fluid terminal on the top side of the substrate, wherein at least one of the plurality of vias is over the top fluid terminal; and a bottom fluid terminal on the bottom side of the substrate in the fluid channel.

* * * * *